United States Patent [19]
Davis et al.

[11] Patent Number: 6,022,749
[45] Date of Patent: Feb. 8, 2000

[54] USING A SUPERLATTICE TO DETERMINE THE TEMPERATURE OF A SEMICONDUCTOR FABRICATION PROCESS

[75] Inventors: Bradley M. Davis; Shengnian Davis Song; Sey-Ping Sun, all of Austin, Tex.

[73] Assignee: Advanced Micro Devices, Inc., Sunnyvale, Calif.

[21] Appl. No.: 09/030,742

[22] Filed: Feb. 25, 1998

[51] Int. Cl.[7] .................................. H01L 31/0328
[52] U.S. Cl. ........................ 438/14; 257/15; 257/22; 257/48; 136/236.1
[58] Field of Search .............. 438/14; 136/227, 136/231, 200, 236.1, 239; 257/15, 48, 22, 28

[56] References Cited

U.S. PATENT DOCUMENTS

| | | | |
|---|---|---|---|
| 4,919,542 | 4/1990 | Nulman et al. | 374/9 |
| 4,996,077 | 2/1991 | Mosleihi et al. | 427/38 |
| 5,415,699 | 5/1995 | Harman | 136/238 |
| 5,429,070 | 7/1995 | Campbell et al. | 118/723 R |
| 5,502,355 | 3/1996 | Mashiro | 315/111.21 |
| 5,564,830 | 10/1996 | Bobel et al. | 374/126 |
| 5,614,055 | 3/1997 | Fairbairn et al. | 156/345 |
| 5,900,071 | 5/1999 | Harman | 136/236.1 |
| 5,907,161 | 5/1999 | Ochi et al. | 257/94 |

Primary Examiner—Charles Bowers
Assistant Examiner—Hsien Ming Lee
Attorney, Agent, or Firm—Kevin L. Daffer; Conley, Rose & Tayon

[57] ABSTRACT

A method is provided for determining the temperature of a semiconductor fabrication process in which a resistivity versus temperature calibration curve for a superlattice structure is created. A plurality of similar superlattice structures which include alternating layers of a conductor and a semiconductor may be annealed at different temperatures. The resistivity of each superlattice structure may then be measured after the superlattice structures have been cooled to room temperature in order to form the calibration curve. A similar superlattice structure may then be subjected to the temperature at which the semiconductor fabrication process is typically performed, causing the resistivity of the superlattice structure to change. Based on the resulting resistivity of the superlattice structure, the calibration curve may be used to determine the process temperature of the superlattice structure during the fabrication process. The length of time that the superlattice structure is subjected to the process temperature is selected to be the time duration of the process whose temperature is being determined. Once the actual process temperature is known, the temperature controls for the process may be adjusted in an attempt to reach the desired process temperature.

12 Claims, 4 Drawing Sheets

USING A SUPERLATTICE TO DETERMINE THE TEMPERATURE OF A SEMICONDUCTOR FABRICATION PROCESS

BACKGROUND OF THE INVENTION

1. Field of the Invention

This invention relates to integrated circuit fabrication and, more particularly, to determining the temperature of a semiconductor fabrication process by forming a resistivity versus temperature calibration curve for a superlattice structure having layers of a conductor interposed between layers of a semiconductor.

2. Description of the Relevant Art

Various processes are involved in the manufacture of a multi-level semiconductor device. Controlling the temperature of several of those processes is necessary to ensure that the resulting integrated circuit is operable and meets design specifications. Well known semiconductor fabrication processes which may require strict control of the processing temperature include, but are not limited to high density plasma deposition, high density plasma etching, plasma enhanced chemical vapor deposition ("PECVD"), low pressure chemical vapor deposition ("LPCVD"), reactive ion etching ("RIE"), various sputter deposition techniques, rapid thermal processing ("RTP"), and furnace annealing. For example, chemical vapor deposition processes and etching processes involve reacting species upon a surface of a semiconductor topography to either form a film or vaporize surface material. Deposition rate and etch rate are dependent upon the reaction rate of those surface reactions, and the reaction rate varies with temperature.

It is particularly critical for the temperature to be uniform across a semiconductor topography during high density plasma deposition or etching. Variations in temperature across a semiconductor topography may result in a non-uniform deposition or etch across the wafer. A film deposited using a high density plasma may, e.g., vary in thickness and stoichiometry across the wafer. A high density plasma may be generated using different types of reaction chambers. A high density plasma contains a relatively high concentration of ions (e.g., more than approximately $10^{12}$ ions/cm$^3$) and excited atoms. One common feature of conventional high density plasma ("HDP") reactors is the independent control over the generation of high density ions and ion energy. One type of high density plasma reactor is the inductively coupled plasma reactor. The plasma in such a reactor is created inside a vacuum chamber by a coiled radio frequency ("RF") antenna. By adjusting the RF current in the antenna, the ion density can be controlled. The ion energy is controlled by another RF power connected to the platform upon which the wafer resides during the deposition or etch.

The measurement of the temperature of a semiconductor topography is thus of significance importance in the field of integrated circuit fabrication. Unfortunately, because of various process conditions, e.g., high vacuum and chemically reactive surroundings, direct measurement of the temperature of a wafer via calibrated platinum film resistances (i.e., thermocouples) and other contact thermometers is generally not possible. For example, ions and excited species created in a high density plasma are highly reactive and could possibly react with the thermocouples themselves. Further, variations in temperature across a wafer make direct measurement of the wafer temperature even more difficult. Multiple thermocouples must be placed in contact with various regions of the wafer during the processing. Moreover, the temperature at one location on the wafer may change over the course of the process, reducing the precision of the temperature measurement at that location. As such, determining the exact temperature of the critical point of a process, e.g., the temperature at which species diffuse to and react upon a topological surface, appears desirable, yet conventionally impossible.

It would therefore be of benefit to develop a method for determining a precise and accurate temperature of a semiconductor topography during the critical part of a fabrication process. Further, it would be desirable to avoid using temperature measurement devices, e.g., thermocouples, which could interact with species during the fabrication process. A method is needed which would allow the process temperature to be determined prior to actually subjecting a semiconductor topography to the fabrication process. Once an accurate measurement of the process temperature is attainable, it would be possible to strictly control the temperature of a semiconductor topography during a fabrication process. The temperature controls could be adjusted in order to approach the targeted process temperature. Eventually the targeted process temperature could be reached across each temperature-read position of the topography, and as a result, the outcome of the fabrication process would be significantly advanced. Consequently, an integrated circuit which operates according to design could be fabricated.

SUMMARY OF THE INVENTION

The problems outlined above are in large part solved by the technique hereof for determining the temperature of a semiconductor fabrication process by forming a resistivity versus temperature calibration curve for a superlattice structure. A similar superlattice structure may then be subjected to the temperature at which the critical portion of the semiconductor fabrication process is typically performed, causing the resistivity of the superlattice structure to change. Based on the resulting resistivity of the superlattice structure subjected to processing ambient, the calibration curve may be used to determine the process temperature of the superlattice structure during the critical portion of the fabrication process. The length of time that the superlattice structure is subjected to the process temperature is selected to be the time duration of the process whose temperature is being determined.

Once the actual process temperature is known, the temperature controls for the process may be adjusted in an attempt to reach the desired process temperature. The technique hereof may be repeated until the desired process temperature is equivalent to the actual process temperature. After calibration of the process temperature, the semiconductor fabrication process may be performed upon a semiconductor topography at the desired process temperature. In this manner, the process temperature of the semiconductor topography may be determined without directly measuring the semiconductor topography temperature. As a result, the process temperature may be strictly controlled, making it possible to achieve the desired outcome of a semiconductor fabrication process. For example, the temperature of an HDP deposition process may be controlled to provide for the desired deposition rate and stoichiometry of the film being deposited.

In an embodiment, a superlattice structure is first formed upon a silicon-based substrate. Alternating thin layers, i.e., sublattices, of a conductor and a semiconductor may be, e.g., sputter deposited across the substrate from targets bearing the conductor and the semiconductor. The sublattices are deposited at a relatively low temperature, i.e., less than about 25° C, to minimize the interdiffusion between the sublattices, thereby forming well-defined interfaces between the sublattices. The conductor and the semiconductor chosen for the superlattice depends upon the type of semiconductor process being analyzed. For a low temperature process, such as an HDP process, a superlattice structure comprising alternating layers of aluminum and silicon may be formed since the melting point of aluminum is between 600° C. and 700° C. and an HDP process is typically performed at a temperature of 200° C. to 400° C. Since the process temperature of an RTP process typically ranges from 600° C. to 1,000° C., the superlattice structure may comprise alternating layers of titanium and titanium silicide which have relatively high melting points. Conductors which may be appropriate for use in the superlattice include, but are not limited to, aluminum, copper, titanium, and tungsten. Semiconductors which may be appropriate for use in the superlattice structure include, but are not limited to, silicon, titanium silicide, and copper silicide.

Multiple similar superlattice structures may be formed as described above, and the superlattice structures may be annealed at different temperatures. The range of anneal temperatures may vary, depending on the type of fabrication process being analyzed. The duration of each anneal is preferably equivalent to the duration of the semiconductor fabrication process whose process temperature is being determined. The number of layers in each superlattice may be adjusted, depending on the composition of the sublattices. It is desirable that the number of layers, i.e., periods, be optimized to achieve the greatest rate of interdiffusion between the layers while the superlattice structure is undergoing anneal. The thickness of each conductor layer is preferably at least 100 Å to ensure that the transport within the conductor is dominated by the ordinary Drude mechanism and not by the quantum localization effect. However, each semiconductor layer is preferably only 50 Å to 100 Å thick. Although each semiconductor layer has a higher resistivity than each conductor layer, the relatively small thicknesses of the semiconductor layers allow the conductor layers to be strongly coupled together in parallel. Immediately after each anneal, the superlattice temperature is allowed to cool to less than 25° C., and then the resistivity of the superlattice structure is measured. As a result of the interdiffusion between the sublattices of the superlattice structure in response to being annealed, the resistivity of the superlattice structure increases. By repeating the above-procedure, a calibration curve of superlattice resistivity may be plotted as a function of superlattice temperature (i.e., the anneal temperature) for a fixed period of time.

Thereafter, a superlattice structure substantially similar to the one used to create the calibration curve is formed. The superlattice structure may be placed within a processing chamber which is typically used for the semiconductor fabrication process being investigated. The processing chamber thus may be, but is not limited to, an HDP deposition chamber, an HDP etch chamber, a PECVD chamber, an LPCVD chamber, an RIE chamber, an RTP chamber, and a sputter chamber. The chamber pressure may be decreased to form a vacuum within the chamber if the semiconductor fabrication process typically requires a vacuum. The chamber may then be heated to what is believed to be the typical temperature of the process and maintained there for the period of time typically required by the process. This period of time is the same as the duration of each anneal used to create the calibration curve. After subjecting the superlattice to the process temperature, and thus causing interdiffusion between the sublattices of the superlattice structure, the superlattice structure is allowed to cool to below 25° C. At the lower temperature, additional diffusion is inhibited from occurring. The process resistivity of the superlattice structure is then measured and located on the previously formed calibration curve. The process temperature is determined to be the temperature which corresponds to this process resistivity on the calibration curve. Since it is possible to determine an accurate process temperature, the temperature controls of the processing chamber may be repeatably adjusted until the actual processing temperature is equivalent to the desired processing temperature. A semiconductor topography may then be subjected to the fabrication process within the processing chamber at the correct temperature.

A superlattice and a single film exhibit very different diffusion properties. The rate at which the concentration of an atomic species varies with time and position is governed by the following diffusion equation which is known as Fick's second law of diffusion:

$$\frac{\partial C(x,t)}{\partial t} = D \frac{\partial^2 C}{\partial x^2}$$

where $C(x,t)$ is the concentration of an atomic species at position x and time t and D is the diffusion coefficient or diffusivity. Considering a semi-infinite length of a film, e.g., an aluminum film, deposited upon a substrate, e.g., a silicon substrate, it can be seen from the above equations that:

$$C(x,t) = \left[\frac{C_0}{2\sqrt{Dt}} \cdot \frac{2}{\sqrt{\pi}}\right] \exp\left(-\frac{x^2}{4Dt}\right)$$

where $C_0$ is the initial concentration. If the film has a finite thickness L, then the corresponding relaxation time, i.e., the time required to reach an essential uniform composition distribution is given by:

$$\tau = \frac{1}{\pi^2} \cdot \frac{L^2}{D}$$

The smaller the relaxation time, $\tau$, the more rapid the diffusion process.

In contrast, the concentration of an atomic species within a superlattice structure may be represented by the following equation:

$$C(x,t) \approx \exp\left[-D_\Lambda \left(\frac{2\pi}{\Lambda}\right)^2 t\right] \cos\left(\frac{2\pi x}{\Lambda}\right) + C_0$$

wherein $D_\Lambda$ is the effective interdiffusion coefficient which depends on the composition modulation wavelength, $\Lambda$, wherein $\Lambda$ is the thickness of the sublattice bilayer in the superlattice structure; and the relaxation time of the superlattice structure is given by:

$$\tau_\Lambda = \frac{1}{\pi^2} \cdot \frac{\Lambda^2}{D_\Lambda}$$

The ratio of the superlattice relaxation time to the relaxation time of a single film deposited upon a substrate is thus represented by:

$$\frac{\tau_\Lambda}{\tau} = \frac{\Lambda^2 D}{L^2 D_\Lambda}$$

Typically, $D_\Lambda$ which depends on the local free energy of the nonhomogeneous system is greater than D. Also, L>Λ which means that the interdifflision is significantly stronger in the superlattice case than in the single film case. For example, a single 1000 Å (i.e., L=1000 Å) aluminum film may be deposited upon a silicon substrate in one case while a superlattice having 10 bilayers of Al/Si in which each layer of aluminum is 100 Å thick and each layer of silicon is 100 Å thick (i.e., Λ=200 Å) may be deposited upon a silicon substrate in another case. Even with $D_\Lambda \approx D$, the relaxation time in the superlattice is reduced by a factor of:

$$\frac{\tau_\Lambda}{\tau} \approx \left(\frac{\Lambda}{L}\right)^2 = 0.04$$

The following Einstein relation shows that the diffusivity of a film is dependent upon the temperature of the film:

$$k_B T \mu = qD$$

where $\mu$ is the mobility, q is the charge per carrier, and T is the temperature. Hence, it can be seen that increasing the temperature of a superlattice, and thereby significantly increasing the difflusion in the superlattice will lead to a change in the resistivity of the superlattice more so than in a single film. Therefore, using a superlattice to calibrate the temperature of a semiconductor fabrication process is much more effective, and offers higher resolution than that provided by a single film.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

Figure 1:
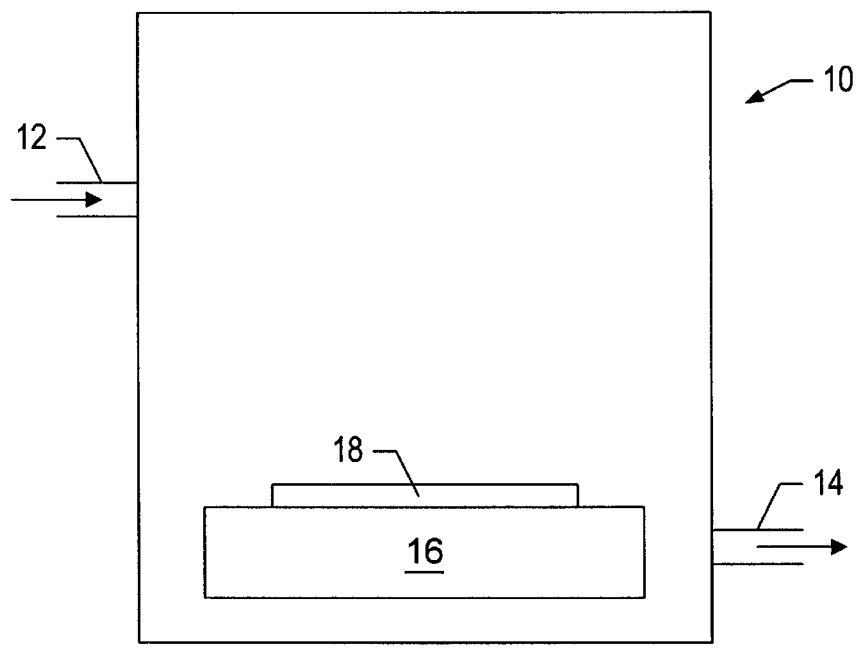
FIG. 1 is a side plan view of a processing chamber which may be employed for the present invention.

Turning now to the drawings, FIG. 1 illustrates an exemplary processing chamber which, in one case, may be used to anneal each of a plurality of superlattice structures while forming a resistivity versus anneal temperature calibration curve for a superlattice structure. In another case, processing chamber 10 may be employed to subject a superlattice structure 18 to a process temperature. The process temperature may vary, depending upon the type of processing chamber being used. The processing chamber 10 may be, but is not limited to, one of the following types of processing chambers: HDP deposition chamber (200° C. to 400° C.); HDP etch chamber (200° C. to 400° C.); PECVD chamber (200° C. to 400° C.); LPCVD chamber (500° C. to 800° C.); RIE chamber (200° C. to 400° C.); RTP chamber (600° C. to above 1,000° C.); and sputter deposition chamber (greater than 200° C.), all of which are well known in the art. Processing chamber 10 may include a platform 16 for holding wafers that comprise semiconductor topographies. In particular, platform 16 may hold a superlattice structure 18. Process chamber 10 may include one or more inlet conduits 12 for passing gas into the chamber and one or more outlet conduits 14 for passing gas out of the chamber. Superlattice structure 18 may be heated to the normal operating temperature of processing chamber 10 after the superlattice structure 18 is positioned upon platform 16.

Figure 2:
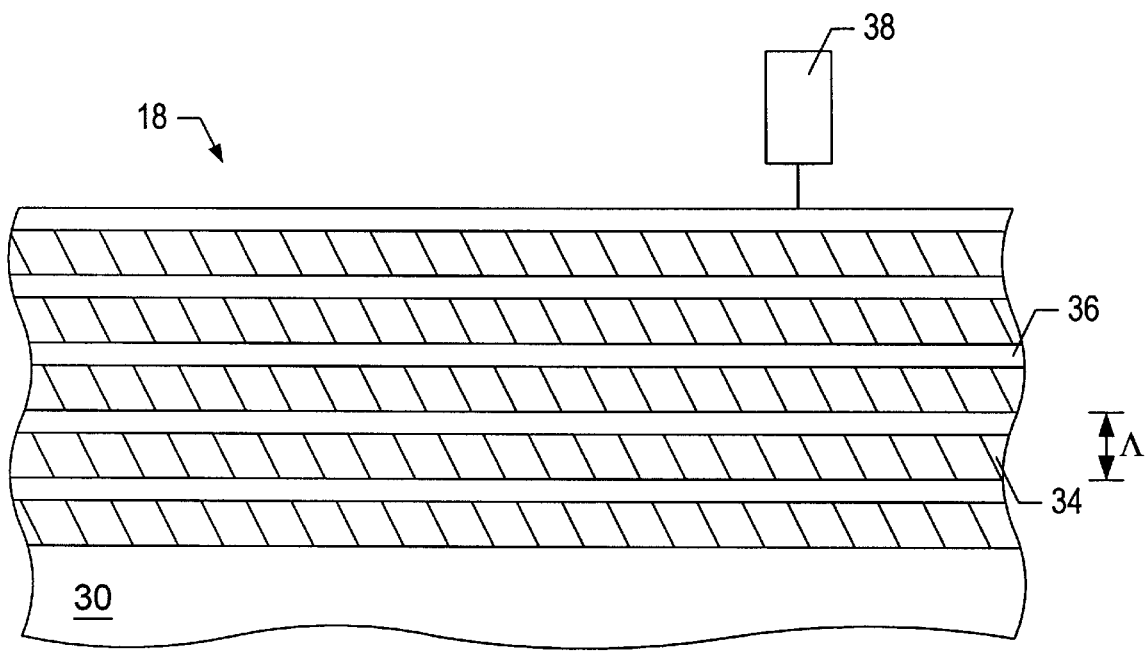
FIG. 2 is a cross-sectional view of a semiconductor topography, wherein a superlattice structure is formed across a silicon substrate.

FIG. 2 illustrates a cross-sectional view of the superlattice structure 18 which includes alternating layers of a conductor 34 and a semiconductor 36 arranged upon a silicon substrate 30. Preferably, substrate 30 comprises single crystalline silicon. In an embodiment in which superlattice structure 18 is subjected to relatively low process temperatures, e.g., during an HDP process, conductor 34 may be composed of aluminum and semiconductor 36 may be composed of silicon. In another embodiment in which superlattice structure 18 is subjected to relatively high temperatures, e.g., during an RTP or a conventional furnace process, conductor 34 may be composed of titanium and semiconductor 36 may be composed of titanium silicide. The layers of conductor 34 and the layers of semiconductor 36 may, e.g., be sputter deposited upon silicon substrate 30. The number of layers may be optimized to achieve the maximum change in bulk resistivity of superlattice structure 18 when the structure is heated to cause interdiffusion between the different layers. The thickness of each layer of conductor 34 is preferably at least 100 Å, and the thickness of each layer of semiconductor 36 is preferably between 50 and 100 Å. The composition modulation wavelength, Λ, of superlattice structure 18 is shown as being the thickness of one of the conductors 34 combined with the thickness of one of the semiconductors 36. FIG. 2 also depicts a device which may be used to measure the resistivity of superlattice structure 18 when an electric stimuli is applied to the superlattice structure 18. Probes may be contacted to the uppermost layer of superlattice structure 18 to determine the resistivity across the entire thickness of superlattice structure 18. A metrology instrument that may be used to measure the resistivity of superlattice structure 18 is the Tencor RS-55/TC, commercially available from Tencor Instruments.

Figure 3:
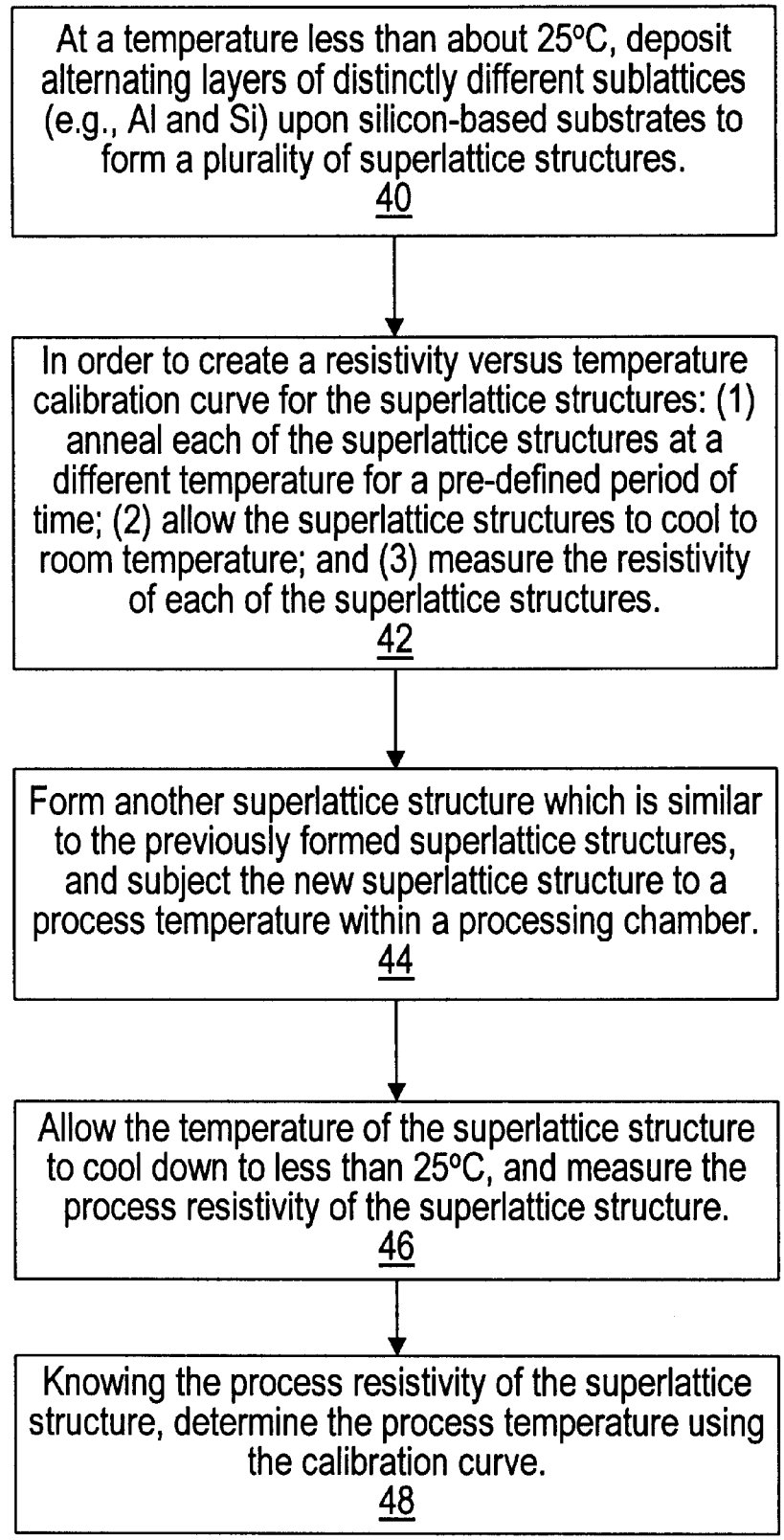
FIG. 3 is a process flow diagram of an embodiment of the present invention.

FIG. 3 depicts a process flow diagram according to an embodiment of the present invention. As shown by block 40, a plurality of substantially similar superlattice structures are first formed by depositing alternating layers of distinctly different sublattices upon silicon-based substrates. Thereafter, as shown by block 42, a resistivity versus temperature calibration curve is formed for the superlattice structures. To obtain the data required for the calibration curve, each of the superlattice structures is annealed in a furnace or a RTA unit at a different temperature for a pre-defined period of time. The range of anneal temperatures may vary, depending upon the temperature range of the fabrication process whose temperature is to be determined in subsequent steps. After a superlattice structure is annealed, it is desirable to allow the structure to cool down to at least room temperature. In this manner, interdiffusion of atoms between the sublattices of the superlattice structure is terminated. As such, the atoms within the superlattice structure are "frozen" at the positions they migrated to during the anneal process. The resistivity of each of the superlattice structures may then be measured in order to create the calibration curve.

As shown by block 44, another superlattice structure which is substantially similar to the previously formed superlattice structures may then be fabricated or fabricated current with the previous superlattice structures. The new superlattice structure is then subjected to a process temperature within a processing chamber. The process temperature is one that is typically used to perform a particular fabrication process upon a semiconductor topography. It is believed that the actual process temperature is initially dissimilar from the targeted process temperature. As shown by block 46, the temperature of the superlattice structure is then allowed to drop below about 25° C. before the resistivity of the superlattice structure is measured. Since the layers of semiconductor are relatively thin, the layers of conductor are strongly coupled together. As shown by block 48, knowing the process resistivity of the superlattice structure, the actual process temperature may be determined as the temperature which corresponds to that particular resistivity on the calibration curve. The process temperature determined in this manner is the temperature at which the critical point of a fabrication process occurs. The heating elements of the processing chamber may be repeatably adjusted until the actual process temperature of a superlattice structure is equivalent to the targeted process temperature.

Figure 4:
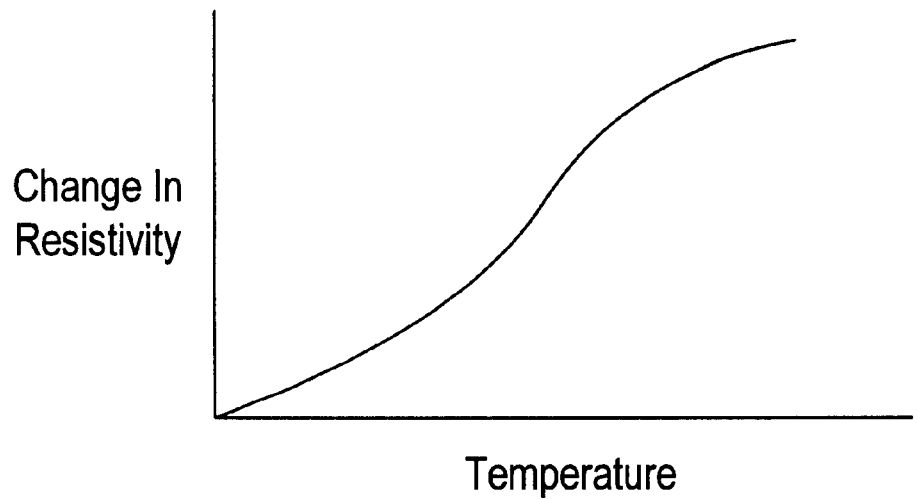
FIG. 4 is a calibration curve of the change in resistivity of a superlattice structure as a function of the anneal temperature.
Figure 5:
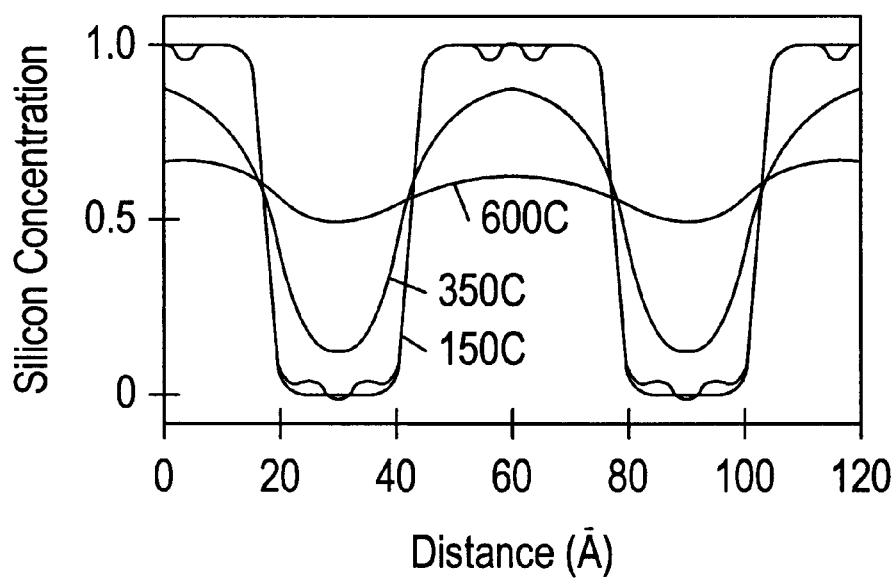
FIG. 5 is a plot of the silicon concentration of similar superlattice structures which have been annealed at different temperatures as a function of the composition modulation wavelength of the corresponding superlattice structure.

FIG. 4 illustrates an exemplary calibration curve in which the change in resistivity of a superlattice structure is plotted as a function of the temperature of the superlattice structure for a fixed period of time. The period of time represented by the calibration curve is the length of time that a semiconductor topography is heated during a fabrication process. As shown by FIG. 4, the resistivity change of a superlattice structure comprising alternating layers of a conductor and a semiconductor increases as the temperature of the superlattice structure rises above a minimum temperature. The resistivity continues to increase as a result of interdiffusion between the semiconductor atoms and the conductor atoms. Prior to being heated, the resistivity of the superlattice structure is relatively low since the thickness of the conductor layers is significantly greater than the thickness of the semiconductor layers. As the interdiffusion progresses, the resistivity of the superlattice structure becomes less like that of the conductor layers and more like that of the semiconductor layers. FIG. 5 is a plot of the silicon concentration at a given position within similar superlattice structures that have been annealed at different temperatures for the same period of time as a function of the composition modulation wavelength, $\Lambda$, (i.e., the distance between the upper surface of a first layer and the lower surface of a second layer which is arranged directly underneath the first layer within the superlattice structure) of the corresponding superlattice structure. Each silicon concentration vs. composition modulation wavelength, $\Lambda$, curve is a cosine curve. FIG. 5 demonstrates that the amplitude of the cosine curve increases as the anneal temperature of the superlattice structure increases, indicating that the change in silicon concentration is greatest at the higher anneal temperature.

Figure 6:
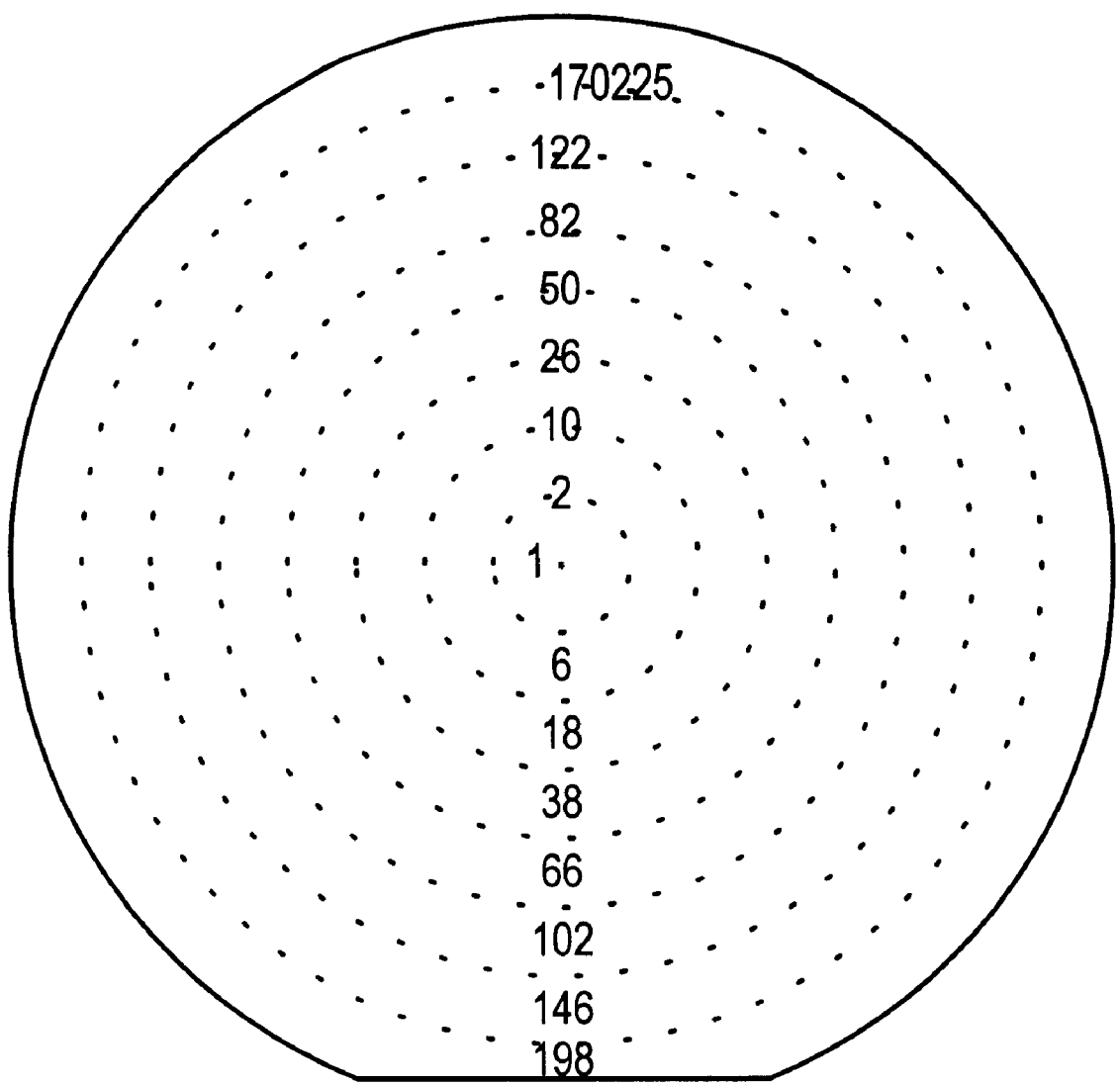
FIG. 6 is a top plan view of a 225-site contour map resistivity measurement on the superlattice structure which may be used to determine the variation in process temperature across the topography.

Turning to FIG. 6, a top plan view of a 225-site contour map shows that the local sheet resistances (hence the resistivities) are measured at 225 sites on the superlattice structure using a RS-55/TC instrument. A calibration curve of resistivity as a function of temperature of a superlattice structure may then be used to determine the actual process temperature of each measured location in the superlattice structure. The actual process temperatures at each measured location may be compared to determine the amount of variation in temperature across the semiconductor topography. Since it is desirable to maintain a uniform temperature across a semiconductor topography during fabrication processes, such as an HDP process, the method hereof is beneficial. After accurate and precise measurements of temperature are made of the superlattice structure, steps may be taken to reduce the fluctuation in temperature across the semiconductor topography. For example, heating elements of the processing chamber may be adjusted to direct more thermal radiation toward certain regions of the chamber than other regions.

It will be appreciated to those skilled in the art having the benefit of this disclosure that this invention is believed to provide a method for determining the temperature of a semiconductor fabrication process by creating a calibration curve of the resistivity of a superlattice versus the temperature of the superlattice. Further modifications and alternative embodiments of various aspects of the invention will be apparent to those skilled in the art in view of this description. For example, multiple superlattice structures arranged upon separate silicon substrates may be spaced apart across a platform within a processing chamber and subjected to a process temperature in order to determine the temperature variation from one superlattice structure to the next. It is intended that the following claims be interpreted to embrace all such modifications and changes and, accordingly, the specification and drawings are to be regarded in an illustrative rather than a restrictive sense.

What is claimed is:

1. A method for determining a processing temperature, comprising:

annealing each of a plurality of substantially similar superlattice structures at a different temperature;

measuring a resistivity of the each of the plurality of superlattice structures to form a calibration curve of the resistivity as a function of the different temperature;

after subjecting another superlattice structure which is substantially similar to the each of the plurality of superlattice structures to a process temperature, measuring a process resistivity of the another superlattice structure; and knowing the process resistivity of the superlattice structure, determining the process temperature using the calibration curve.

2. The method of claim 1, wherein subjecting the another superlattice structure to the process temperature comprises placing the another superlattice structure within a processing chamber selected from the group consisting of a high density plasma deposition chamber, a high density plasma etch chamber, a PECVD chamber, an LPCVD chamber, a reactive ion etch chamber, a rapid thermal processing chamber, and a sputter deposition chamber.

3. The method of claim 1, wherein the plurality of superlattice structures comprises layers of a conductor interposed between layers of a semiconductor.

4. The method of claim 3, wherein the conductor comprises a metal selected from the group consisting of aluminum, copper, titanium, and tungsten.

5. The method of claim 3, wherein the layers of the conductor and the layers of the semiconductor are deposited upon a single crystalline silicon substrate.

6. The method of claim 1, wherein the plurality of superlattice structures comprises layers of aluminum interposed between layers of silicon.

7. The method of claims 6, wherein each of the layers of aluminum comprises a thickness of at least 100 Å, and each of the layers of silicon comprises a thickness of 50 to 100 Å.

8. The method of claim 1, wherein the plurality of superlattice structures and the another superlattice structure are formed at a temperature less than approximately 25° C.

9. The method of claim 1, further comprising subjecting the plurality of superlattice structures to a temperature less than approximately 25° C. subsequent to the annealing of each of the plurality of superlattice structures and prior to the measuring of the resistivity of the each of the plurality of superlattice structures.

10. The method of claim 1, wherein the annealing of the each of the plurality of superlattice structures is performed for a pre-defined period of time, and wherein the another superlattice structure is subjected to the process temperature for the pre-defined period of time.

11. The method of claim 1, further comprising, until the process temperature is substantially equivalent to a desired temperature, repeatably (1) adjusting the process temperature, (2) measuring the process resistivity of the another superlattice structure after subjecting the another superlattice structure to the process temperature, and (3) knowing the process resistivity, determining the process temperature using the calibration curve.

12. A method for determining a processing temperature, comprising:

providing a calibration curve of resistivity of each of a plurality of superlattice structures as a function of a different anneal temperature applied to each of the plurality of the superlattice structures;

measuring a process resistivity of another superlattice structure after subjecting the another superlattice structure to a process temperature; and knowing the process resistivity of the another superlattice structure, determining the process temperature using the calibration curve.

* * * * *